United States Patent [19]
Brooks

[11] Patent Number: 5,365,199
[45] Date of Patent: Nov. 15, 1994

[54] AMPLIFIER WITH FEEDBACK HAVING HIGH POWER SUPPLY REJECTION

[75] Inventor: Todd L. Brooks, Austin, Tex.
[73] Assignee: Motorola, Inc., Schaumburg, Ill.
[21] Appl. No.: 100,789
[22] Filed: Aug. 2, 1993
[51] Int. Cl.$^5$ .............................................. H03F 1/38
[52] U.S. Cl. ..................................... 330/291; 330/292
[58] Field of Search ................ 330/277, 288, 291, 292, 330/293

[56] References Cited

U.S. PATENT DOCUMENTS

| | | | |
|---|---|---|---|
| 3,601,712 | 8/1971 | Elazar | 330/277 X |
| 4,713,625 | 12/1987 | Whatley | 330/149 |
| 4,912,427 | 5/1990 | Rybicki | 330/257 |
| 4,933,644 | 6/1990 | Fattaruso et al. | 330/258 |
| 5,057,789 | 10/1991 | Nagaraj | 330/264 |
| 5,083,095 | 1/1992 | Madaffari | 330/277 |
| 5,113,148 | 5/1992 | Theus | 330/253 |
| 5,117,200 | 5/1993 | Scott, III | 330/253 |
| 5,148,120 | 9/1993 | Kano et al. | 330/264 |

Primary Examiner—Steven Mottola
Attorney, Agent, or Firm—Daniel D. Hill

[57] ABSTRACT

A class A amplifier (20) includes an amplifier (21), a capacitor (22), and an output stage (23). The output stage (23) includes a source-follower transistor (24) and a feedback circuit (25). The source-follower transistor (24) receives an analog signal from the amplifier (21) and provides a corresponding output signal to a load. The feedback circuit (25) provides current feedback to maintain a relatively constant drain current in the source-follower transistor (24). The class A amplifier (20) with the feedback circuit (25) provides high current drive capability with low quiescent power consumption, high power supply rejection, high voltage gain, and stable operation without the use of a Miller compensation capacitor.

15 Claims, 2 Drawing Sheets

AMPLIFIER WITH FEEDBACK HAVING HIGH POWER SUPPLY REJECTION

FIELD OF THE INVENTION

This invention relates generally to amplifiers and more particularly to an amplifier with feedback having high power supply rejection.

BACKGROUND OF THE INVENTION

An amplifier may comprise a transconductance amplifier first stage, and an output stage, where the output stage provides unity voltage gain for driving a low impedance load. The output stage may comprise a source-follower transistor. Important criteria for an amplifier having a source-follower output stage include wide bandwidth, high current drive capability, low quiescent power consumption, high power supply rejection, and stable operation.

FIG. 1 illustrates in schematic diagram form, commonly used class AB amplifier 10. Class AB amplifier 10 includes amplifier 11 and output stage 12. Output stage 12 includes P-channel transistors 13, 14, and 15, current source 16, and capacitor 17. P-channel transistor 14 is coupled as a source-follower transistor for providing an output signal labeled "$V_{OUT}$". Amplifier 11 is a conventional single-stage transconductance amplifier for receiving a noninverting input signal labeled "$+V_{IN}$", and an inverting input signal labeled "$-V_{IN}$", and for providing a single-ended output signal.

Prior art class AB amplifier 10 provides low impedance output drive and strong current drive capability with relatively low quiescent power consumption. However, because of the large voltage gain and low frequency pole in output stage 12, Miller compensation capacitor 17 is required to stabilize amplifier 10. A problem with using Miller compensation is that it degrades the power supply rejection of output stage 12. In order for the drive current of output stage 12 to remain constant when the power supply varies, the gate-source voltage of transistor 13 should remain constant. For this to occur, the gate voltage of transistor 13 should track the power supply voltage. However, this causes the voltage across Miller compensation capacitor 17 to vary with the power supply voltage, and generates a power supply dependent current in capacitor 17 which degrades the amplifier power supply rejection.

Another problem with output stage 12 is that when required to drive a high voltage across a sufficiently small impedance load (not shown), the drain current in P-channel transistor 15 becomes larger than the current provided by current source 16. This causes the gate voltage of source-follower transistor 14 to rise. The current in source-follower transistor 14 is reduced to near zero as the gate voltage rises and source-follower transistor 14 becomes substantially non-conductive. This effectively disconnects the gain path in output stage 12 between the gate of P-channel transistor 15 and the output terminal of output stage 12. The voltage gain of output stage 12 reduces to that of a simple common-source transistor (P-channel transistor 13) in conjunction with the output load.

SUMMARY OF THE INVENTION

Accordingly, there is provided, in one form, a class AB amplifier output stage having high power supply rejection. The class AB amplifier includes a source-follower transistor and a feedback circuit. The source-follower transistor has a gate for receiving an input signal, a source for providing an output signal, and a drain having a drain current. The feedback circuit is coupled between the source and the drain of the source-follower transistor. Variations in the drain current of the source-follower transistor due to changes in a load current are detected, and in response, feedback is provided to the source of the source-follower transistor to limit the variations in the drain current. These and other features and advantages will be more clearly understood from the following detailed description taken in conjunction with the accompanying drawings.

DESCRIPTION OF A PREFERRED EMBODIMENT

Figure 1:
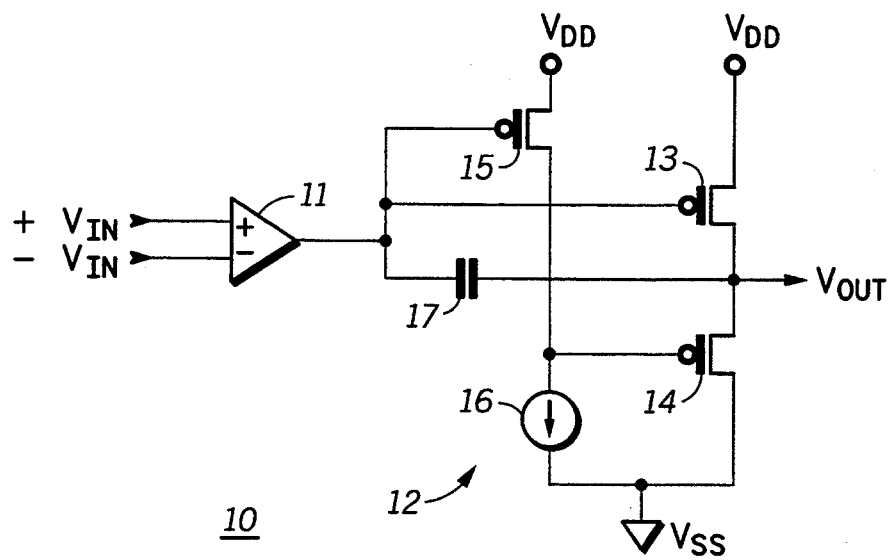
FIG. 1 illustrates in schematic diagram form a prior art class AB amplifier.
Figure 2:
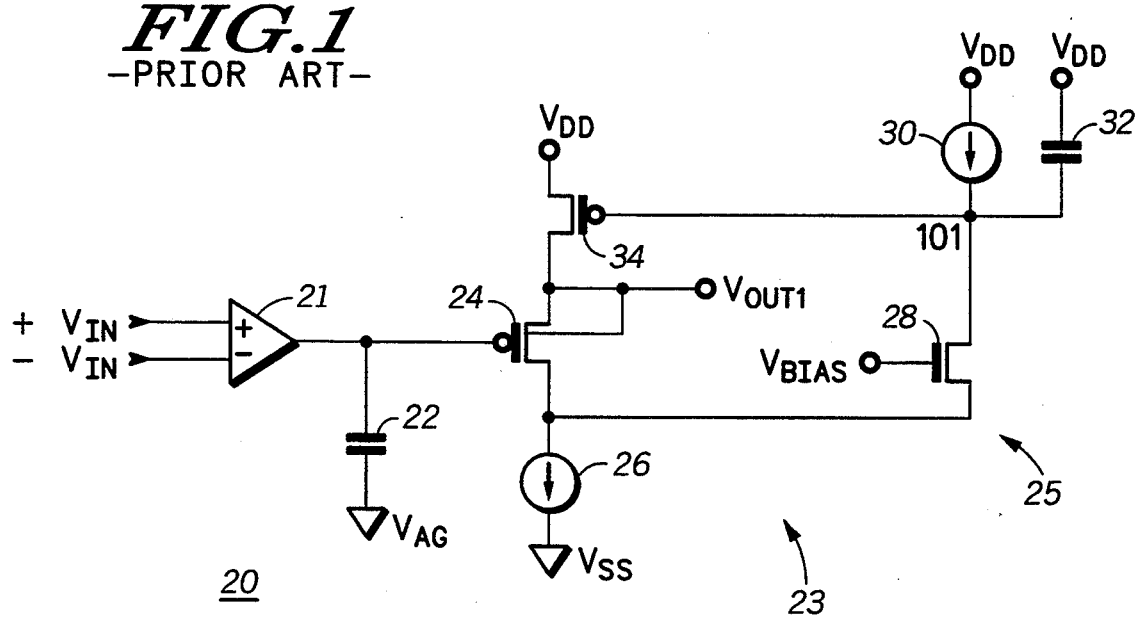
FIG. 2 illustrates in schematic diagram form a class A amplifier in accordance with the present invention.

FIG. 2 illustrates in schematic diagram form a class A amplifier 20 in accordance with the present invention. Class A amplifier 20 is implemented using CMOS technology and includes amplifier 21, capacitor 22, and output stage 23. In a preferred embodiment, amplifier 21 is a conventional single-stage transconductance amplifier for receiving differential input signals and in response, providing a single-ended output signal. However, in other embodiments, amplifier 21 can be an operational amplifier, differential amplifier, or any other type of input amplifier which is capable of coupling one or more input signals to one or more amplifier output stages. Note that output stage 23 can be used without amplifier 21 in other embodiments, and can be used as a replacement of a source-follower transistor in any circuit requiring a high transconductance, low distortion source-follower device.

Amplifier 21 has a noninverting input terminal for receiving a first input signal labeled "$+V_{IN}$", and an inverting input terminal for receiving a second input signal labeled "$-V_{IN}$", and an output terminal. Capacitor 22 is coupled between the output terminal of amplifier 21 and an analog ground terminal labeled "$V_{AG}$", and functions to limit a bandwidth of amplifier 21 as required to maintain adequate phase margin in class A amplifier 20.

Output stage 23 includes source-follower transistor 24 and feedback circuit 25. Feedback circuit 25 includes current source 26, N-channel transistor 28, current source 30, capacitor 32, and P-channel transistor 34. Source-follower transistor 24 has a gate connected to the output terminal of amplifier 21, a source connected to an output terminal for providing an output signal labeled "$V_{OUT1}$", and a drain. Current source 26 has a first terminal connected to the drain of source-follower transistor 24, and a second terminal connected to a power supply voltage terminal labeled "$V_{SS}$". N-channel transistor 28 has a drain connected to node 101, a gate for receiving a bias voltage labeled "$V_{BIAS}$", and a source connected to the drain of source-follower transistor 24. Current source 30 has a first terminal connected to a power supply voltage terminal labeled "$V_{DD}$", and a second terminal connected to the drain of N-channel transistor 28 at node 101. Capacitor 32 has a first plate electrode connected to the second terminal of current source 30 at node 101, and a second plated electrode connected to power supply voltage terminal $V_{DD}$. P-channel transistor 34 has a source connected to power supply voltage terminal $V_{DD}$, a gate connected to node 101, and a drain connected to the source of source-follower transistor 24. In a preferred embodiment, power supply voltage terminal $V_{DD}$ receives a positive power supply voltage equal to approximately 5.0 volts, and power supply voltage terminal $V_{SS}$ is connected to ground potential. Analog ground terminal $V_{AG}$ receives a voltage approximately halfway between the positive power supply voltage and ground, or approximately 2.5 volts. In other embodiments, $V_{DD}$ may receive a positive power supply voltage as low as approximately 2.0 volts, and $V_{AG}$ may be at the potential of $V_{DD}$, $V_{SS}$, or at another intermediate potential depending on the voltage potential at which output signal $V_{OUT1}$ is referenced.

In operation, amplifier 21 (FIG. 2) receives noninverting input signal $+V_{IN}$ and inverting input signal $-V_{IN}$, and provides an output signal to the gate of source-follower transistor 24 of output stage 23. Output stage 23 functions as a unity gain driver circuit and includes negative current feedback provided by feedback circuit 25. Output stage 23 is capable of driving a range of relatively low impedance loads, with constant gain, and low quiescent power consumption. The circuit does not require Miller compensation, thus providing high power supply rejection. The negative feedback is provided by feedback circuit 25 to maintain a relatively constant current in source-follower transistor 24 by adjusting the current in P-channel transistor 34 to compensate for variations in the load current of output signal $V_{OUT1}$. The transconductance of source-follower transistor 24 is effectively boosted by a factor of $1+A_i$, where $A_i$ represents the current gain of feedback circuit 25.

The bandwidth and stability of class A amplifier 20, and of output stage 23 are interdependent. The interdependence of class A amplifier 20 and output stage 23 is an inverse function of the load impedance connected to the output terminal of amplifier 20. When the circuit is used with a sufficiently high impedance load, the gate-source voltage of source-follower transistor 24 is a weak function of the current flowing in P-channel transistor 34. Therefore, under this condition, the bandwidth and stability of class A amplifier 20 does not depend heavily upon the bandwidth of output stage 23. If feedback circuit 25 fails to operate at high frequencies due to limited bandwidth in output stage 23, then this causes little degradation in the stability of amplifier 20.

Current sources 26 and 30 provide relatively constant currents. Node 101 is a relatively high impedance node and provides a bias voltage to the gate of P-channel transistor 34. If the current through source-follower transistor 24 starts to change because the load current changes, the current through N-channel transistor 28 changes. Because node 101 has a relatively high impedance, a small change in current through node 101 causes a large change in the voltage at node 101. For example, if the load current starts to increase, the current through source-follower transistor 24 starts to decrease. Since current source 26 provides a relatively constant current, the current through N-channel transistor 28 increases. A small increase in current through N-channel transistor 28 causes a large voltage drop at node 101, and causes the bias voltage at the gate of P-channel transistor 34 to be reduced. P-channel transistor 34 provides a variable current source. The current through P-channel transistor 34 is inversely proportional to the voltage at node 101, thus keeping the current through source-follower transistor 24 relatively constant as the load current varies. By keeping the current through source-follower transistor 24 relatively constant, feedback circuit 25 ensures that source-follower transistor 24 operates as a unity gain buffer with a relatively constant gate-source voltage and with relatively low distortion.

Capacitor 32 provides a dominant pole which stabilizes feedback circuit 25. Since a large output impedance at node 101 causes a low frequency pole at node 101, capacitor 32 should be sufficiently large to ensure that the pole is dominant and therefore keep the bandwidth of the feedback circuit below the pole at the output terminal of output stage 23. Unlike Miller compensation capacitor 17 of prior art class AB amplifier 10, neither of capacitors 22 or 32 degrades the power supply rejection of class A amplifier 20. Bias voltage $V_{BIAS}$ is set to a voltage that is high enough to maintain a relatively high impedance in current source 26, but low enough so that the voltage swing of output signal $V_{OUT1}$ is not affected. Bias voltage $V_{BIAS}$ should be set at approximately one to two MOSFET diode voltage drops above $V_{SS}$. As noted above, Miller compensation is not needed to stabilize the circuit, thus improving the power supply rejection, while still maintaining strong current drive capability and low quiescent power consumption. Amplifier 20 is useful in applications requiring high gain and high accuracy at low frequencies. (Note: that for purposes of discussion, low frequencies are defined as being less than 1 megahertz, while high frequencies are defined as being greater than one megahertz.) Applications include, but are not limited to, reference voltage generators, off chip drivers, and audio amplifiers.

Figure 3:
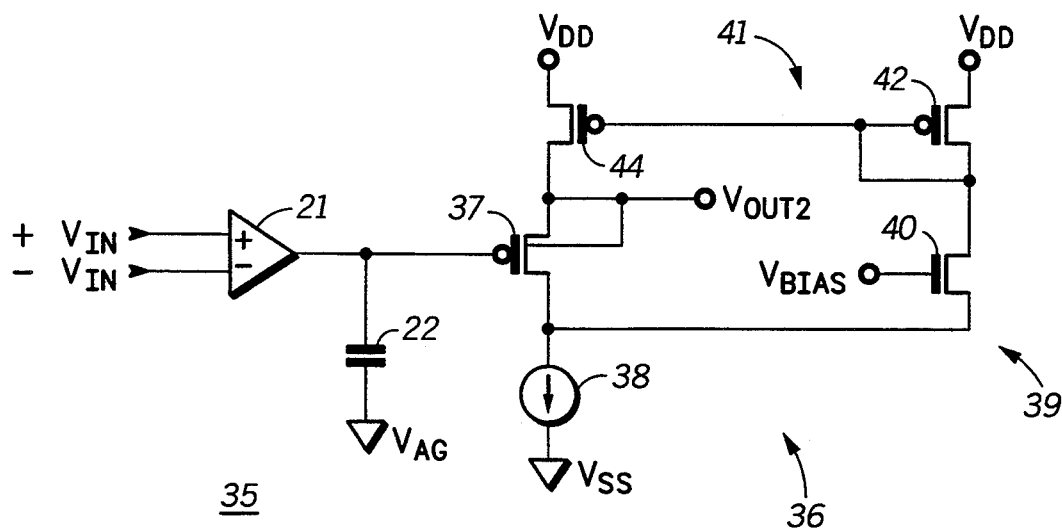
FIG. 3 illustrates in schematic diagram form a class A amplifier in accordance with another embodiment of the present invention.

FIG. 3 illustrates in schematic diagram form class A amplifier 35 in accordance with another embodiment of the present invention. Note that like elements of the various embodiments have been given the same reference numbers. Class A amplifier 35 includes amplifier 21, capacitor 22, and output stage 36. Output stage 36 includes source-follower transistor 37 and feedback circuit 39. Feedback circuit 39 includes current source 38, N-channel transistor 40, and P-channel transistors 42 and 44. P-channel transistors 42 and 44 are connected to form current mirror 41.

In output stage 36, source-follower transistor 37 has a source connected to an output terminal for providing an output signal labeled "$V_{OUT2}$", a gate connected to an output terminal of amplifier 21, and a drain. Current source 38 includes a first terminal connected to the drain of source-follower transistor 37, and a second terminal connected to $V_{SS}$. N-channel transistor 40 has a source connected to the first terminal of current source 38, a gate for receiving bias voltage "$V_{BIAS}$", and a drain. P-channel transistor 42 has a source connected to $V_{DD}$, a gate and a drain, both of which are connected to the drain of N-channel transistor 40. P- channel transistor 44 has a source connected to $V_{DD}$, a gate connected to the gate of P-channel transistor 42, and a drain connected to the source of source-follower transistor 44.

Feedback circuit 39 functions similarly to feedback circuit 25 of FIG. 2. Feedback circuit 39 provides negative current feedback to the source of source-follower transistor 37 in order to ensure a relatively constant drain current through source-follower transistor 37 as the output load current varies. However, unlike feedback circuit 25 of output stage 23 (FIG. 2), feedback circuit 39 does not have a high impedance node, therefore, the bandwidth of output stage 36 may be very large. The bandwidth is limited by a pole at the output terminal of output stage 36, where the pole is a function of the load impedance. Feedback circuit 39 keeps the current through source-follower transistor 37 relatively constant for substantially linear operation with low distortion. Since Miller compensation is not needed, power supply rejection is improved over prior art output stages which use Miller compensation. Amplifier 35 is useful in applications requiring wide bandwidth, including but not limited to, wide bandwidth drivers and video amplifiers.

In operation, if the current through source-follower transistor 37 starts to decrease because the current of output signal $V_{OUT2}$ increases, the current through N-channel transistor 40 increases because current source 38 provides a relatively constant current source. Current mirror 41 receives the current from N-channel transistor 40, and a percentage of the current through diode-connected P-channel transistor 42 is mirrored by P-channel transistor 44 based on their relative conductivities. As the current through P-channel transistor 42 increases, the current provided to source-follower transistor 37 increases to compensate for the increased load current. If the load current decreases, feedback circuit 36 detects a corresponding increase in the drain current of source-follower transistor 37, and decreases the current provided by P-channel transistor 44. In a preferred embodiment, the conductivity of P-channel transistor 44 is proportionally greater than the conductivity of P-channel transistor 42, thus the current through P-channel transistor 44 is greater than the current through P-channel transistor 42, and the gain of current mirror 41 is greater than unity.

Output stages 23 and 36 are capable of sourcing larger load currents than prior art output stage 12. Note that the current sinking capability of the embodiments of FIG. 2 and FIG. 3 is limited by the amount of current provided by the current sources. The maximum current that can be sinked by class A amplifier 20 is equal to the current in current source 26 minus the current in current source 30. The maximum current that can be sinked by class A amplifier 35 is equal to the current provided by current source 38. As discussed above, output stage 23 of FIG. 2 provides high current gain at the expense of lower bandwidth. Output stage 36, on the other hand, provides lower gain with a higher bandwidth. As compared with output stage 23 (FIG. 2), output stage 36 is capable of driving large capacitive loads. Like the embodiment of FIG. 2, output stage 36 does not require Miller compensation, thus providing the advantage of greater power supply rejection.

Figure 4:
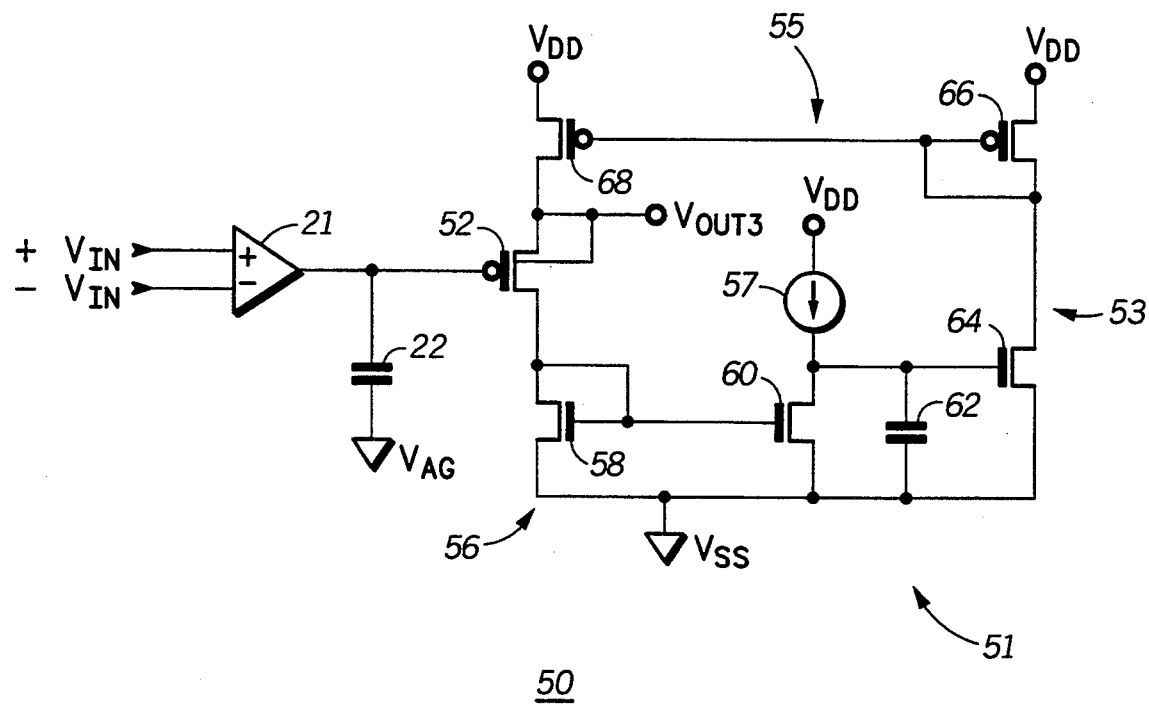
FIG. 4 illustrates in schematic diagram form a class AB amplifier in accordance with another embodiment of the present invention.

FIG. 4 illustrates in schematic diagram form class AB amplifier 50 in accordance with another embodiment of the present invention. Class AB amplifier 50 includes amplifier 21, capacitor 22, and output stage 51. Output stage 51 includes source-follower transistor 52, and feedback circuit 53. Feedback circuit 53 includes current mirror 56, current source 57, capacitor 62, N-channel transistor 64, and current mirror 55. Current mirror 56 includes N-channel transistor 58 and 60. Current mirror 55 includes P-channel transistors 66 and 68.

Source-follower transistor 52 has a gate connected to the output terminal of output stage 51, a source for providing an output signal labeled "$V_{OUT3}$", and a drain. N-channel transistor 58 has a drain and a gate, both connected to the drain of source-follower transistor 52. Current source 57 has a first terminal connected to $V_{DD}$, and a second terminal. N-channel transistor 60 has a drain connected to the second terminal of current source 57, a gate connected to the gate of N-channel transistor 58, and a source connected to $V_{SS}$. Capacitor 62 has a first plate electrode connected to the drain of N-channel transistor 60, and a second plate electrode connected to $V_{SS}$. N-channel transistor 64 has a gate connected to the drain of N-channel transistor 60, a drain, and a source connected to $V_{SS}$. P-channel transistor 66 has a source connected to $V_{DD}$, and a gate and a drain, both the gate and the drain connected to the drain of N-channel transistor 64. P-channel transistor 68 has a source connected to $V_{DD}$, a gate connected to the gate of P-channel transistor 66, and a drain connected to the source of source-follower transistor 52.

Like the embodiments of FIG. 2 and FIG. 3, output stage 51 functions as a unity gain buffer circuit with negative current feedback. In operation, feedback circuit 53 monitors the drain current of source-follower transistor 52 and provides a feedback current to control the current through P-channel transistor 68 such that the drain current remains relatively constant for varying load currents. The transconductance of source-follower transistor 52 is boosted by a factor of $1+A_i$, where $A_i$ represents the current gain of feedback circuit 53. $A_i$ is typically around 100 and can be increased further by cascoding N-channel transistor 60. Like the embodiments depicted in FIG. 2 and FIG. 3, output stage 51 does not use Miller compensation for stability, and thereby avoids undesirable power supply gain, while still maintaining good current drive capability and low quiescent power supply consumption. Capacitor 62 provides the dominant pole for output stage 51 without affecting power supply rejection.

In operation, current source 57 provides a constant current source. Current mirror 56 receives the current at the drain of source-follower transistor 52 and provides a current at the second terminal of current source 57 that is proportional to the drain current of source-follower transistor 52. Since the current provided by current source 57 is relatively constant, the voltage at the gate of N-channel transistor 64 is proportional to the change in drain current of source-follower transistor 52. Likewise, current mirror 55 receives the current from N-channel transistor 64 and mirrors the current in P-channel transistor 68. If the current in source-follower transistor 52 decreases because of increased load current, feedback circuit 53 provides more current to the source of source-follower transistor 52. If the current in source-follower transistor 52 increases because of decreased load current, feedback circuit 53 provides less current to the source of source-follower transistor 52. The gate-source voltage of source-follower transistor 52 remains relatively constant. Output stage 51 is capable of sourcing larger load currents than prior art output stage 12, at the expense of a slight reduction in the voltage swing of output stage 51 in the direction of $V_{SS}$. As compared with output stages 23 and 36, output stage 51 is capable of sinking much larger load currents. Amplifier 50 is useful in applications requiring high gain and high accuracy at low frequency.

Figure 5:
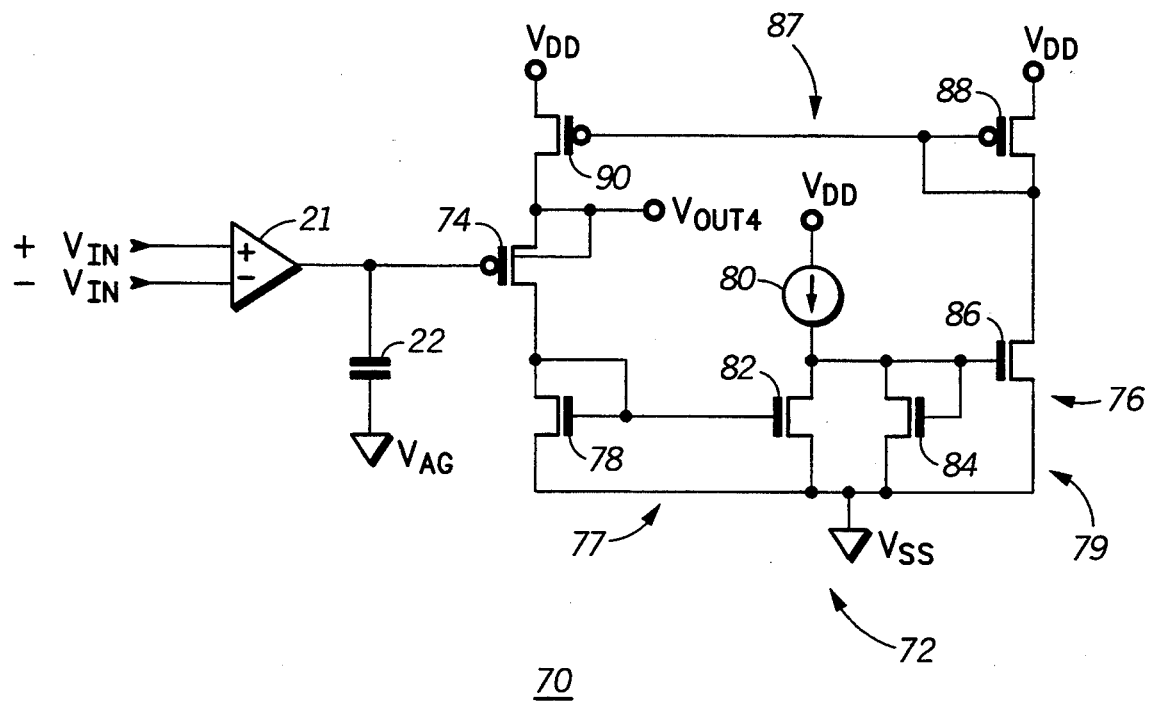
FIG. 5 illustrates in schematic diagram form a class AB amplifier in accordance with another embodiment of the present invention.

FIG. 5 illustrates in schematic diagram form class AB amplifier 70 in accordance with another embodiment of the present invention. Class AB amplifier 70 includes amplifier 21, capacitor 22, and output stage 72. Output stage 72 includes source-follower transistor 74 and feedback circuit 76. Feedback circuit 76 includes current mirror 77, current source 80, N-channel transistors 84, and 86, and current mirror 87. Current mirror 77 includes N-channel transistors 78 and 82, and current mirror 87 includes P-channel transistors 88 and 90. N-channel transistors 84 and 86 form current mirror 79.

Source-follower transistor 74 has a source connected to an output terminal of output stage 72 for providing an output signal labeled "$V_{OUT4}$", a gate connected to the output terminal of amplifier 21, and a drain. N-channel transistor 78 has a gate and a drain connected to the drain of source-follower transistor 74, and a source connected to $V_{SS}$. Current source 80 has a first terminal connected to $V_{DD}$, and a second terminal. N-channel transistor 82 has a drain connected to the second terminal of current source 80, a gate connected to the gate of N-channel transistor 78, and a source connected to $V_{SS}$. N-channel transistor 84 has a drain and a gate, both connected to the drain of N-channel transistor 82, and a source connected to $V_{SS}$. N-channel transistor 86 has a drain, a gate connected to the drain of N-channel transistor 82, and a source connected to $V_{SS}$. P-channel transistor 88 has a source connected to $V_{DD}$, and a gate and a drain, both the gate and the drain connected to the drain of N-channel transistor 86. P-channel transistor 90 has a source connected to $V_{DD}$, a gate connected to the gate of P-channel transistor 88, and a drain connected to the source of source-follower transistor 90.

Output stage 72 is similar to output stage 51 of FIG. 4, except that capacitor 62 (FIG. 4) is replaced by diode connected N-channel transistor 84 (FIG. 5). The operation of output stage 72 is similar to that of output stage 51. Current source 80 provides a constant current source. Current mirror 77 receives the current at the drain of source-follower transistor 74 and provides a current at the second terminal of current source 80 that is proportional to the drain current of source-follower transistor 74. Since the current provided by current source 80 is relatively constant, the voltage at the gate of N-channel transistor 86 is proportional to the change in drain current of source-follower transistor 74. Likewise, current mirror 87 receives the current from N-channel transistor 86 and mirrors the current in P-channel transistor 90. If the current in source-follower transistor 74 decreases because of increased load current, feedback circuit 76 provides more current to the source of source-follower transistor 74. If the current in source-follower transistor 74 increases because of decreased load current, feedback circuit 76 provides less current to the source of source-follower transistor 74.

Unlike output stage 51, the dominant pole in output stage 72 is located at the output terminal of output stage 72, and is a function of the output impedance connected to the output terminal of output stage 72. As compared to output stage 51 (FIG. 4), output stage 72 is capable of driving larger capacitive loads. Also, the bandwidth of output stage 72 is improved at the expense of a reduction in the current feedback gain, $A_i$, and a reduction in current drive capability.

There are various strengths and limitations to consider when comparing the illustrated embodiments of the present invention. As compared with the embodiments of FIG. 2 and FIG. 3, the embodiments of FIG. 4 and FIG. 5 are class AB amplifiers, and thus are capable of sinking much larger currents. The embodiments illustrated in FIG. 4 and FIG. 5 have slightly reduced voltage swing in the direction of $V_{SS}$ because the voltage at the drain of source-follower transistor 24 (FIG. 4) and the drain of source-follower transistor 37 (FIG. 5) is a diode voltage drop above $V_{SS}$. Note that the embodiments of FIG. 2 and FIG. 3 have better frequency response, and can be made to operate with wider bandwidth than the embodiments of FIG. 4 and FIG. 5. However, the embodiment of FIG. 5, as compared to the embodiment of FIG. 3 can have a higher feedback current gain because there are three current mirrors in the embodiment of FIG. 5.

While the invention has been described in the context of a preferred embodiment, it will be apparent to those skilled in the art that the present invention may be modified in numerous ways and may assume many embodiments other than that specifically set out and described above. For example, it should be apparent that any of the embodiments above may be implemented with differential outputs. In a fully differential amplifier structure the problem associated with power supply noise being coupled to the output signal is reduced because the noise is rejected by virtue of the differential nature of the circuit. However, power supply rejection can still be a problem in differential amplifiers due to mismatched output legs and mismatched output impedances resulting from large differential signals. Therefore, the present invention may be utilized to reduce power supply noise in such applications as well. Accordingly, it is intended by the appended claims to cover all modifications of the invention which fall within the true spirit and scope of the invention.

What is claimed is:

1. A CMOS amplifier with feedback having high power supply rejection, comprising:
   an amplifier stage having first and second input terminals and an output terminal;
   a stabilizing capacitor having a first plate electrode coupled to the output terminal of the amplifier stage, and a second plate electrode coupled to an analog ground terminal;
   a source-follower transistor having a gate coupled to the output terminal of the amplifier stage for receiving an input signal, a source for providing an output signal, and a drain having a drain current; and
   a negative feedback circuit, coupled between the source and the drain of the source-follower transistor, for detecting variations in the drain current of the source-follower transistor due to changes in a load current, and in response to detecting a variation in the drain current, providing negative current feedback to the source of the source-follower transistor to limit the variations in the drain current.

2. The amplifier output stage of claim 1, wherein the feedback circuit comprises a current source for providing a current to the source of the source-follower transistor that changes inversely proportional to a change in the drain current of the source-follower transistor.

3. The amplifier output stage of claim 1, wherein the feedback circuit comprises:
   a current source, coupled to the drain of the source-follower transistor, for providing a relatively constant current source;
   an N-channel transistor having a source coupled to the drain of the source-follower transistor, a gate for receiving a bias voltage, and a drain; and
   a current mirror, coupled to the drain of the N-channel transistor and to the source of the source-follower transistor, for providing a current to the source of the source-follower transistor that is inversely proportional to changes in the drain current.

4. The amplifier output stage of claim 1, wherein the feedback circuit comprises:
   a first current mirror, coupled to the drain of the source-follower transistor, for providing a first current proportional to the drain current;
   an N-channel transistor having a gate coupled to the first current mirror for receiving a reference voltage proportional to the first current, the N-channel transistor providing a second current proportional to the reference voltage; and
   a second current mirror, for receiving the second current, and in response, providing a third current to the source-follower transistor that is inversely proportional to the second current.

5. An amplifier output stage, comprising:
   a source-follower transistor having a gate for receiving an input signal, a source for providing an output signal, and a drain having a drain current;
   a first current source having a first terminal coupled to the drain of the source-follower transistor, and a second terminal coupled to a first power supply voltage terminal;
   a first transistor having a first current electrode coupled to the drain of the source-follower transistor, a control electrode for receiving a bias voltage, and a second current electrode;
   a second current source having a first terminal coupled to a second power supply voltage terminal, and a second terminal coupled to the second current electrode of the first transistor; and
   a second transistor having a first current electrode coupled to the second power supply voltage terminal, a control electrode coupled to the second terminal of the second current source, and a second current electrode coupled to the source of the source-follower transistor.

6. The amplifier output stage of claim 5, further comprising an input amplifier stage having first and second input terminals, and an output terminal coupled to the gate of the source-follower transistor.

7. The amplifier output stage of claim 6, further comprising a stabilizing capacitor having a first plate electrode coupled to the output terminal of the input amplifier stage, and a second plate electrode coupled to an analog ground terminal.

8. An amplifier output stage, comprising:
   a source-follower transistor having a gate for receiving an input signal, a source for providing an output signal, and a drain having a drain current;
   a current source, coupled to the drain of the source-follower transistor, for providing a relatively constant current source;
   a first transistor having a first current electrode coupled to the drain of the source-follower transistor, a control electrode for receiving a bias voltage, and a second current electrode; and
   a current mirror, coupled to the second current electrode of the first transistor and to the source of the source-follower transistor, for providing a current to the source of the source-follower transistor that is inversely proportional to changes in the drain current.

9. The amplifier output stage of claim 8, further comprising an input amplifier stage having first and second input terminals, and an output terminal coupled to the gate of the source-follower transistor.

10. The amplifier output stage of claim 9, further comprising a stabilizing capacitor, the stabilizing capacitor having a first plate electrode coupled to the output terminal of the input amplifier stage, and a second plate electrode coupled to an analog ground terminal.

11. An amplifier output stage, comprising:
   a source-follower transistor having a gate for receiving an input signal, a source for providing an output signal, and a drain having a drain current;
   a first transistor having both a first current electrode and a control electrode coupled to the drain of the source-follower transistor, and a second current electrode coupled to a first power supply voltage terminal;
   a current source having a first terminal coupled to a second power supply voltage terminal, and a second terminal;
   a second transistor having a first current electrode coupled to the second terminal of the current source, a control electrode coupled to the control electrode of the first transistor, and a second current electrode coupled to the first power supply voltage terminal;
   a third transistor having a first current electrode, a control electrode coupled to the first current electrode of the second transistor, and a second current electrode coupled to the first power supply voltage terminal;
   a fourth transistor having a first current electrode coupled to the second power supply voltage terminal, a control electrode and a second current electrode both coupled to the first current electrode of the third transistor; and
   a fifth transistor having a first current electrode coupled to the second power supply voltage terminal, a control electrode coupled to the control electrode of the fourth transistor, and a second current electrode coupled to the source of the source-follower transistor.

12. The amplifier output stage of claim 11, further comprising a capacitor having a first plate electrode coupled to the first current electrode of the second transistor, and a second plate electrode coupled to the first power supply voltage terminal.

13. The amplifier output stage of claim 11, further comprising a sixth transistor having a first current electrode and a control electrode, both coupled to the first current electrode of the second transistor, and a second current electrode coupled to the first power supply voltage terminal.

14. The amplifier output stage of claim 11, further comprising an input amplifier stage having first and second input terminals, and an output terminal coupled to the gate of the source-follower transistor.

15. The amplifier output stage of claim 14, further comprising a stabilizing capacitor, the stabilizing capacitor having a first plate electrode coupled to the output terminal of the input amplifier stage, and a second plate electrode coupled to an analog ground terminal.

* * * * *